United States Patent

Eguchi et al.

(10) Patent No.: US 9,318,161 B2
(45) Date of Patent: Apr. 19, 2016

(54) NON-VOLATILE MEMORY ROBUST START-UP USING ANALOG-TO-DIGITAL CONVERTER

(71) Applicants: Richard K. Eguchi, Austin, TX (US); Jon S. Choy, Austin, TX (US)

(72) Inventors: Richard K. Eguchi, Austin, TX (US); Jon S. Choy, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 403 days.

(21) Appl. No.: 13/679,515

(22) Filed: Nov. 16, 2012

(65) Prior Publication Data

US 2014/0140161 A1 May 22, 2014

(51) Int. Cl.
| | |
|---|---|
| G11C 5/14 | (2006.01) |
| G11C 16/30 | (2006.01) |
| G11C 29/02 | (2006.01) |
| G11C 29/04 | (2006.01) |

(52) U.S. Cl.
CPC *G11C 5/145* (2013.01); *G11C 5/14* (2013.01); *G11C 16/30* (2013.01); *G11C 29/021* (2013.01); *G11C 29/028* (2013.01); *G11C 2029/0409* (2013.01)

(58) Field of Classification Search
CPC ............ G11C 5/14; G11C 5/145; G11C 16/30
USPC .................... 365/226; 324/139, 509; 327/536
See application file for complete search history.

(56) References Cited

U.S. PATENT DOCUMENTS

| | | | |
|---|---|---|---|
| 6,166,960 A * | 12/2000 | Marneweck | G11C 16/30 365/185.24 |
| 6,424,570 B1 | 7/2002 | Le et al. | |
| 6,642,757 B2 | 11/2003 | Ikehashi et al. | |
| 6,774,710 B2 | 8/2004 | Li | |
| 6,937,517 B2 | 8/2005 | Pekny et al. | |
| 7,418,604 B2 | 8/2008 | Bliley et al. | |
| 7,772,910 B2 | 8/2010 | Lee et al. | |
| 2008/0030235 A1 | 2/2008 | Sun et al. | |
| 2010/0097149 A1 | 4/2010 | Yeung et al. | |
| 2014/0084936 A1* | 3/2014 | Pan et al. | 324/509 |
| 2014/0254299 A1 | 9/2014 | Eguchi et al. | |

OTHER PUBLICATIONS

Final Office Action mailed Jul. 20, 2015 for U.S. Appl. No. 13/789,017, 13 pages.
Non-Final Office Action mailed Oct. 6, 2014 for U.S. Appl. No. 13/789,017, 16 pages.

* cited by examiner

*Primary Examiner* — Toan Le

(57) ABSTRACT

In accordance with at least one embodiment, an onboard analog-to-digital converter (ADC) on a system-on-a-chip (SOC) is utilized to determine whether a charge pump output for a non-volatile memory (NVM) is correct or not. The SOC is directed to wait until the output is within an expected range before moving to the next step in a start-up procedure. If the maximum allowed start-up time is exceeded, an error signal is sent to the SOC such that the application can react to it.

20 Claims, 5 Drawing Sheets

US 9,318,161 B2

NON-VOLATILE MEMORY ROBUST START-UP USING ANALOG-TO-DIGITAL CONVERTER

CROSS-REFERENCE TO RELATED APPLICATION

The present application is related to co-pending U.S. patent application Ser. No. 13/789,017, entitled "ROBUST MEMORY START-UP USING CLOCK COUNTER" filed on Mar. 7, 2013, the entirety of which is herein incorporated by reference.

BACKGROUND OF THE INVENTION

1. Field of the Invention

This disclosure relates generally to electronic devices and, more specifically, to electronic devices having memory.

2. Description of the Related Art

Firmware or operational parameters used to control operation of a system may be stored in non-volatile memory (NVM) and loaded from the NVM to prepare a system for operation. The system may not operate properly if the configuration information stored in the NVM is not retrieved properly during a system start-up process, such as when transient fault conditions or other errors during the startup process cause the NVM to provide incorrect information at the expected time. Such lack of coordination of the memory operation with operation of the rest of the system can cause the system to attempt to operate with erroneous configuration information and to fail.

BRIEF DESCRIPTION OF THE SEVERAL VIEWS OF THE DRAWINGS

The present invention may be better understood, and its features made apparent to those skilled in the art by referencing the accompanying drawings.

The use of the same reference symbols in different drawings indicates similar or identical items.

DETAILED DESCRIPTION OF THE INVENTION

In accordance with at least one embodiment, an onboard analog-to-digital converter (ADC) module of an integrated circuit, such as a system-on-a-chip (SOC), is utilized to determine whether a charge pump output for a non-volatile memory (NVM) is within a specified parameter, such as a desired voltage. The integrated circuit is directed to wait until the charge pump output is within an expected range before moving to the next step in a start-up procedure involving the NVM. If a maximum allowed start-up time is exceeded without the charge pump output reaching the expected range, an error signal is sent to the SOC such that the application can react to it.

A charge pump output is used by a memory array to provide proper voltage relationships to perform memory operations, such as memory read, erase, and program operations. Having the charge pump come up correctly assists in assuring proper performance for start-up, read, erase, and program operations of the NVM. Proper charge pump performance during start up assures proper access of NVM memory cells that store parameter values that are used to further configure the NVM for normal operation. Proper access of such NVM memory cells allows configuration information, such as parameter values, to be properly retrieved during a system start-up process even when transient fault conditions or other errors occurring during the start-up process would otherwise cause the NVM to provide incorrect information at the expected time, thereby avoiding adverse consequences on system operation. By assuring coordination of the memory operation with operation of the rest of the system, the system can be assured to operate with valid configuration information and to avoid failure. Thus, system reliability can be enhanced by assuring proper charge pump performance during start-up, in accordance with at least one embodiment.

Figure 1:
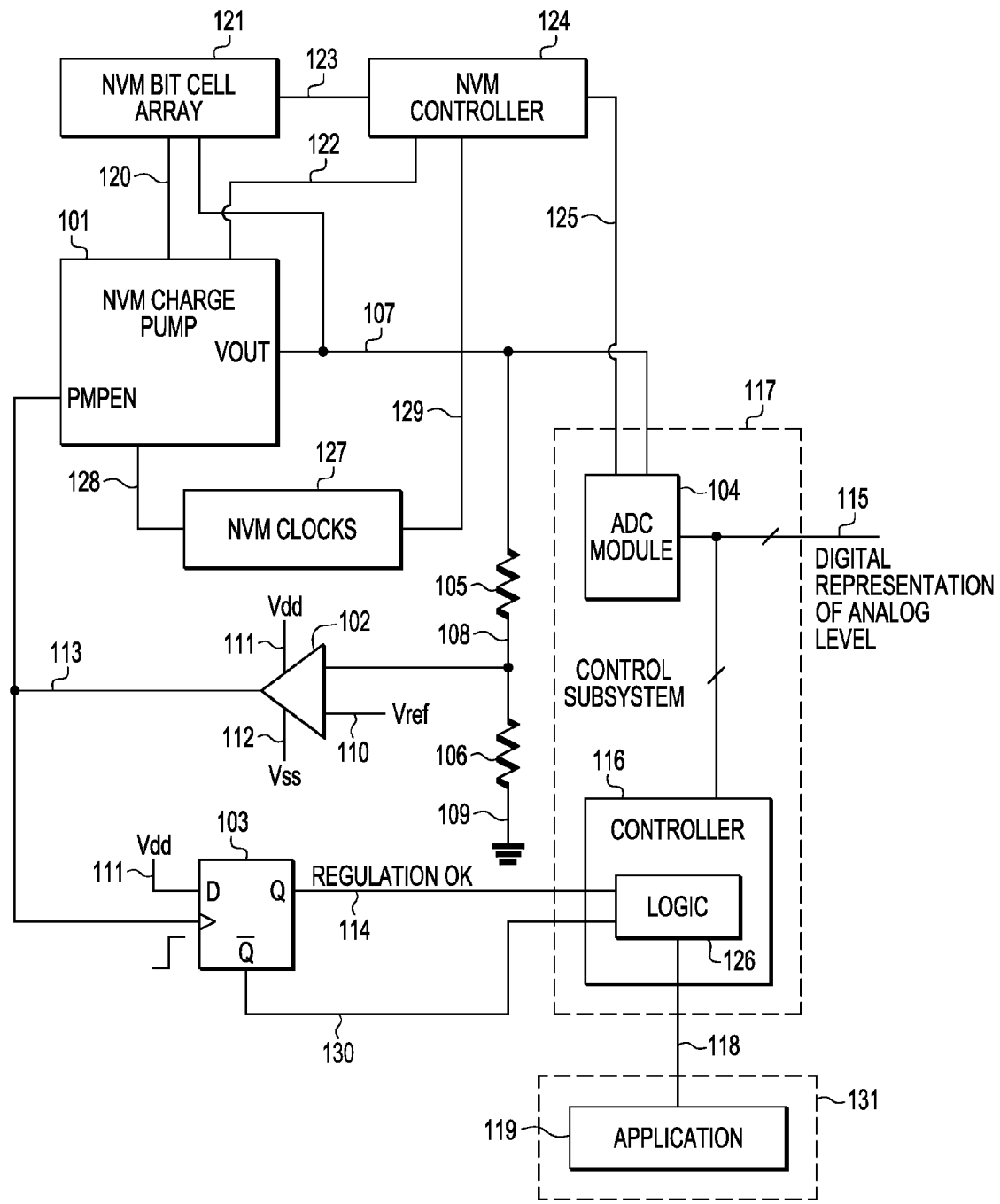
FIG. 1 is a block diagram illustrating NVM apparatus in accordance with at least one embodiment.

FIG. 1 is a block diagram illustrating NVM apparatus in accordance with at least one embodiment. The NVM apparatus 100 comprises charge pump 101, comparator 102, D flip-flop 103, analog-to-digital converter (ADC) module 104, a voltage divider comprising resistors 105 and 106, controller 116, application 119, bit cell array 121, NVM clocks 127, and NVM controller 124. Charge pump 101 is connected via connection 120 to bit cell array 121. Charge pump 101 is connected via connection 122 to NVM controller 124. Charge pump 101 is connected via connection 128 to NVM clocks 127. NVM clocks 127 are connected via connection 129 to NVM controller 124. NVM clocks 127 provide clock signals to control the operation of NVM components. As an example, NVM clocks 127 can provide a clock signal to control a controlled voltage of NVM charge pump 101. As another example, NVM clocks 127 can provide a clock signal to control access to NVM bit cell array 121. As yet another example, NVM clocks 127 can provide a clock signal to operate NVM controller 124. Bit cell array 121 is connected via connection 123 to NVM controller 124. NVM controller 124 may also be connected via connection 125 to ADC module 104. Charge pump 101 includes an output labeled VOUT that provides an output voltage, also referred to herein as VOUT, at node 107 to bit cell array 121 and to a first terminal of resistor 105 and may also be connected to an analog input of ADC module 104. Bit cell array 121 may use the output voltage VOUT at node 107 to control voltage differences between nodes of the bit cells to perform memory operations, for example, at least one of a memory read operation, a memory erase operation, a memory write operation, and the like. A second terminal of resistor 105 is connected to a first terminal of resistor 106 and to a first input of comparator 102 at node 108 and may also be connected to an input of ADC module 104. A second terminal of resistor 106 is connected to ground at node 109. Thus, ADC module 104 may, in accordance with at least one embodiment, receive an input from output voltage Vout of charge pump 101 via node 107 or may, in accordance with at least one embodiment, receive an input from the center of the voltage divider formed by resistors 105 and 106.

A second input 110 of comparator 102 is connected to a reference voltage Vref. A positive supply voltage input 111 of comparator 102 is connected to positive supply voltage Vdd.

A negative supply voltage input 112 is connected to negative supply voltage Vss. An output 113 of comparator 102 is connected to a pump enable input PMPEN of charge pump 101 and to a clock input of D flip-flop 103. A positive supply voltage Vdd is connected to data input 111 of D flip-flop 103. A non-inverted output Q of D flip-flop 103 is connected to controller 116 via node 114 to provide a REGULATION OK output signal to controller 116. Controller 116 is connected to a clear input of D flip-flop 103 via node 130 to allow controller 116 to reset D flip-flop 103 to a clear state.

A bus 115 connects ADC module 104 to controller 116. Controller 116 comprises logic 126. Logic 126 may, for example, be implemented as a finite state machine or, as another example, as firmware comprising logical operations, wherein the firmware may be executed on a processor, for example, controller 116, to perform at least one method. In other embodiments, controller 116 may be a hard-wired circuit. In accordance with at least one embodiment, ADC module 104 is integrated with controller 116 within control subsystem 117. Controller 116 is connected to application 119 via connection 118. Application 119 is instruction-based program code, executed on a processor, for providing functionality for an end user of a product comprising the NVM. The processor may, for example, be a general purpose processor or a special purpose processor. The processor may be integrated on the same semiconductor die as the NVM (e.g., in a system-on-chip (SOC)) or may be implemented as a separate device. In the embodiment illustrated in FIG. 1, processor 131 is the processor on which application 119 is executed. In accordance with at least one embodiment, access to NVM bit cell array 121 by application 119 may be controlled by logic 126 inhibiting execution of application 119 until measurement of the charge pump output indicates the NVM is ready to be accessed, for example by providing a signal to processor 131. As an example, the signal may cause processor 131 to inhibit execution of application 119 or, as another example, application 119 may be able to check the state of the signal and delay its own execution until the NVM is ready to be accessed.

NVM bit cell array 121 stores data, including user information and configuration information, in a non-volatile manner (e.g., such that the data is not lost when power is removed from the NVM). NVM controller 124 controls operation of the NVM, for example, controlling access to the NVM bit cell array 121 and controlling the operation of NVM charge pump 101.

NVM charge pump 101 provides at least one controlled voltage to the NVM bit cell array 121, wherein the at least one controlled voltage can be specified by the NVM bit cell array 121. The at least one controlled voltage may be used, for example, to perform memory operations on the NVM, such a memory read operations, memory write operations, memory erase operations, and the like. Control subsystem 117 provides monitoring of the operation of the NVM charge pump 101 and signaling of the status of the NVM charge pump 101 to the NVM controller 124 and to the application 119. Within the control subsystem 117, the ADC module 104 provides measurement of the output of the NVM charge pump 101, and controller 116 provides control functionality of the NVM based on the measurement provided by the ADC module 104. Within the controller 116, the logic 126 directs the operation of the controller 116.

The voltage divider comprising resistors 105 and 106 provides scaling of the voltage present at the output of the NVM charge pump 101 to a level compatible with an input of the ADC module 104, thus compensating for the event where the ADC module 104 does not have a range sufficient to measure the output of the NVM charge pump 101 directly. The comparator 102 compares the scaled voltage provided by the voltage divider comprising resistors 105 and 106 to a reference voltage 110 and provides an output at node 113 used to enable and disable the NVM charge pump 101 and to clock a supply voltage at node 111 through D flip-flop 103 to provide a regulation OK signal at node 114. D flip-flop 103 provides the regulation OK signal at node 114 in response to transition of the state of the output at node 113 of the comparator 102. In accordance with at least one embodiment, the comparator 102 may compare a scaled voltage provided by a capacitive divider, a transistor divider, or another type of passive or active divider or linear or nonlinear divider instead of, or in combination with, a resistive divider, such as the voltage divider comprising resistors 105 and 106. Linear or nonlinear impedance elements having a real, imaginary, or complex impedance may be used in place of resistors 105 and 106 to obtain the scaled voltage for comparator 102 to compare to the reference voltage 110.

In accordance with at least one embodiment, ADC module 104 may be used to monitor a charge pump output of NVM charge pump 101 during an initial start-up process, for example, preventing access to NVM bit cell array 121 until the charge pump output of NVM charge pump 101 is within an acceptable range. For example, any read, erase, or program operations on NVM bit cell array 121 may be prevented until the charge pump output of the NVM charge pump 101 is within an acceptable range. The acceptable range may be, as an example, a fixed acceptable range or, as another example, a variable acceptable range. Examples of a variable acceptable range include an acceptable range that varies in relation to an operational mode (e.g., reading, erasing, programming, power saving, and the like) of the NVM, an acceptable range that varies between an initial start-up process and subsequent operation, an acceptable range that varies in accordance with wear of NVM cells, and an acceptable range that varies in accordance with a type of NVM cells. After start-up ADC module 104 may be used to monitor a charge pump output of NVM charge pump 101 on an ongoing basis during operation of a system comprising a NVM even long after an initial start-up process. For example, ADC module 104 may be used to monitor a charge pump output of NVM charge pump 101 prior to a proposed erase operation or prior to a proposed program operation occurring during operation long after any initial start-up process.

In yet another embodiment, ADC module 104 may be used to monitor a charge pump output of NVM charge pump 101 during initial start-up process, and D flip-flop 103 may be used to monitor the charge pump output of the NVM charge pump 101 on an ongoing basis during operation following the conclusion of the initial start-up process. For example, ADC module 104 may be used to prevent any reading, erasing or programming of NVM bit cell array 121 until the charge pump output of the NVM charge pump 101 is within an acceptable range, and the REGULATION OK output signal at the Q output of D flip-flop 103 at node 114 may be used to allow controller 116 to monitor the charge pump output of the NVM charge pump 101 on an ongoing basis during operation following the conclusion of the initial start-up process. To facilitate monitoring of the charge pump output on an ongoing basis, controller 116 is able to reset D flip-flop 103 on an occasional basis via 130, which is connected to a clear input of D flip-flop 103.

Figure 2:
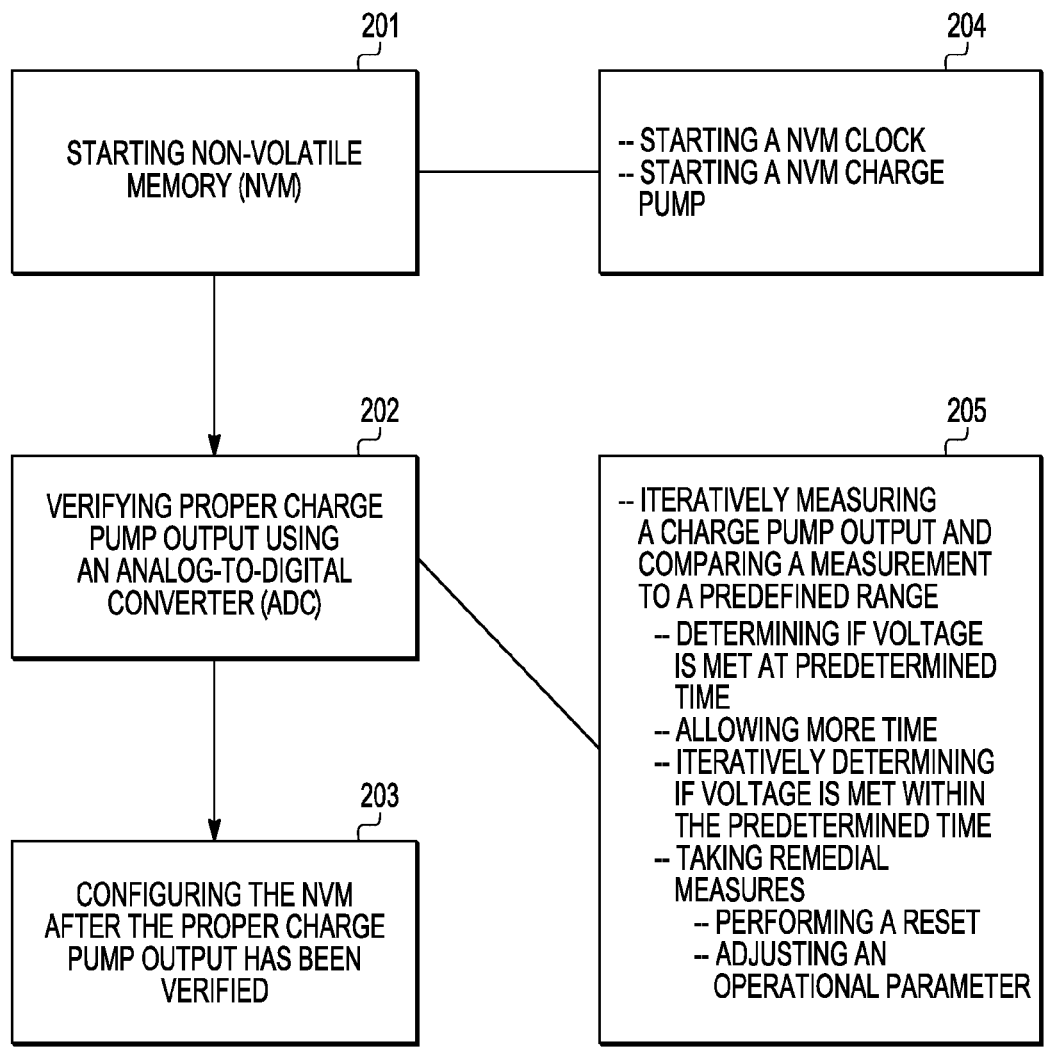
FIG. 2 is a flow diagram illustrating a method for start-up of a NVM using an analog-to-digital converter (ADC) module in accordance with at least one embodiment.

FIG. 2 is a flow diagram illustrating a method for start-up of a NVM using an analog-to-digital converter (ADC) in accordance with at least one embodiment. The method 200 begins in block 201. In block 201, a non-volatile memory (NVM) is started. The start-up of the NVM at 201 can be accomplished in various manners, including those indicated at block 204. As an example, referring to FIG. 1, starting of the NVM can include starting the NVM clocks 127. As another example, referring to FIG. 1, starting the NVM can include starting a NVM charge pump 101. From block 201, the method continues to block 202.

In block 202, proper charge pump output is verified using an analog-to-digital converter (ADC). As an example, referring to FIG. 1, a proper charge pump output of NVM charge pump 101 at node 107 is verified using ADC module 104. The verification of block 202 can be accomplished in various manners, including those indicated at block 205. For example, verifying proper operation may comprise an iterative process of measuring the charge pump output of the NVM charge pump and comparing the measurement to a predefined range is performed. As an example, in response to a maximum start-up time having been exceeded, the iteratively measuring the charge pump output is discontinued and, instead, an error status message is issued. As an example, an error message can be issued to an SOC controller. As another example, more time can be allowed for the charge pump to achieve a value within the predefined range. As an example, referring to FIG. 1, controller 116 allows more time for the NVM charge pump 101 to achieve a value within the predefined range. As further indicated at block 205, various remedial measures can be used in the process of verifying proper charge pump output. For example, a reset operation can be performed, or an operational parameter of the charge pump can be adjusted.

As an example, controller 116 can perform various reset operations, such as resetting a NVM clock, resetting a NVM charge pump, resetting the NVM as a whole (e.g., an entire product, for example, an entire vehicle, an entire consumer product, an entire industrial product, etc.), or resetting an SOC comprising the NVM. As an example, referring to FIG. 1, the reset operation may be performed on NVM clocks 127.

In accordance with at least one embodiment, the level of reset operation performed may be escalated iteratively. For example, a first reset operation may be performed at a low level (e.g., by resetting a NVM clock, a NVM charge pump, the like, or any combination thereof), a second reset operation may, if necessary, be performed at a higher level, and a subsequent reset operation may, if necessary, be performed at an even higher level (e.g., by resetting the system as a whole). In accordance with at least one embodiment, such iterative escalation of reset operations may be performed without issuing an error status message. In accordance with at least one embodiment, such iterative escalation of reset operations may be accompanied by issuance of error status messages, which may, for example, help minimize the disruption resulting from the increasing levels of reset operations.

Alternatively, or in combination with resets, an operational parameter of the charge pump can be iteratively adjusted. As an example, referring to FIG. 1, an operational parameter of the NVM charge pump 101 is iteratively adjusted. From block 202, the method continues to block 203. In block 203, the method proceeds with configuration of the NVM after the proper charge pump output has been verified. As an example, referring to FIG. 1, controller 116 proceeds with configuration of the NVM after the proper charge pump output has been verified. As an example, referring to FIG. 1, NVM controller 124 proceeds with configuration of the NVM after the proper charge pump output has been verified. As an example, referring to FIG. 1, application 119 proceeds with configuration of the NVM after the proper charge pump output has been verified.

Figure 3:
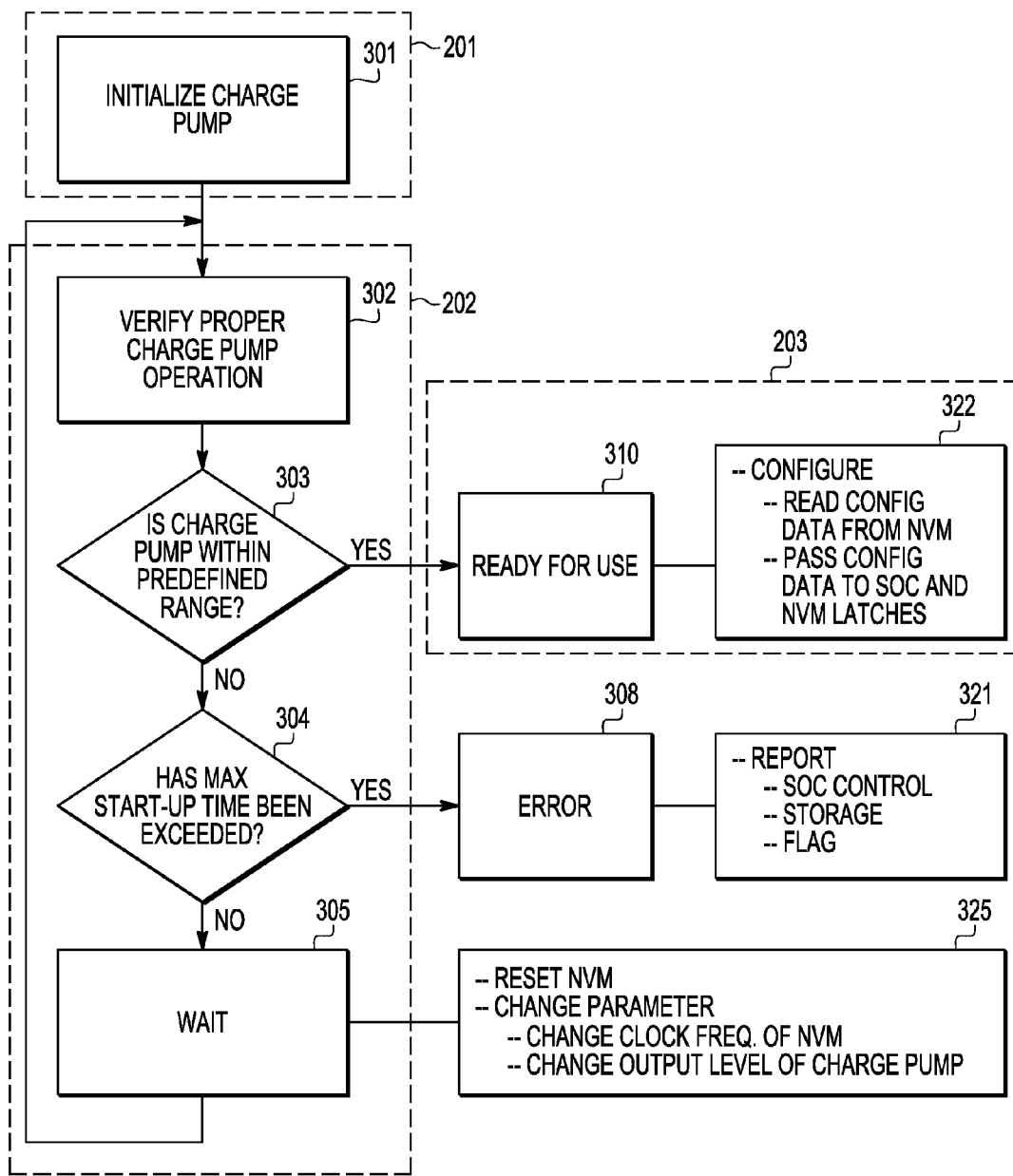
FIG. 3 is a flow diagram illustrating a method for start-up of a NVM using an analog-to-digital converter (ADC) module in accordance with at least one embodiment.

FIG. 3 is a flow diagram illustrating a more detailed method for start-up of a NVM using an analog-to-digital converter (ADC) in accordance with at least one embodiment. As an example, referring to FIG. 1, the method 300 uses ADC 104. The method 300 begins in block 301. In block 301, a charge pump for a non-volatile memory (NVM) is started. As an example, referring to FIG. 1, NVM charge pump 101 is started. Block 301 may be considered to be an embodiment of block 201 of FIG. 2. From block 301, the method continues to block 302. The progression from block 301 to block 302 can occur with or without delay, wherein such a delay can be an indefinite delay, where operation of the system comprising the NVM may continue during the period of such delay. As an example, such delay may be of an amount of time expected to allow a charge pump initialized in block 301 to be properly operating by the time proper operation of the charge pump is verified in step 302.

In block 302, a charge pump output of the charge pump is verified. As an example, an analog-to-digital converter (ADC) is utilized to measure the charge pump output. As an example, referring to FIG. 1, ADC module 104 measures the charge pump output at node 107 of NVM charge pump 101. In accordance with at least one embodiment, the ADC may be taken captive (i.e., not used for other uses) until the NVM is determined to be ready for use. In accordance with at least one embodiment, the ADC need not be taken captive. As another example, an on-board ADC is utilized to measure the charge pump output. As another example, a dedicated ADC is utilized to measure the charge pump output. It will be appreciated such an on-board ADC may be located at various locations, such as: within the NVM device; within a system-on-a-chip (SOC); within a system-in-package (SIP), which may, for example, comprise multiple semiconductor chips stacked within a single integrated circuit (IC) package. In an example where the charge pump output is an internal voltage not accessible at the pins of the integrated circuit (IC) package containing the NVM charge pump, use of an on-board ADC can provide access to such internal voltage for measurement. The ADC may be dedicated, wherein the exclusive function of the ADC is to measure the output of an NVM charge pump. In accordance with at least one embodiment, the ADC may be shared. Block 302, along with decision block 303, decision block 304, and block 305, may be considered to be an embodiment of block 202 of FIG. 2. In other embodiments, the charge pump output may be compared to a reference voltage, for example, using an analog comparator, which may serve as a one-bit ADC relative to reference value. Two or more comparisons may be used to define a range of voltages to facilitate determination of whether the charge pump output has a voltage within a predefined range. Accordingly, an ADC may be a one-bit ADC or a multiple-bit ADC and may or may not provide a comparison function depending on whether the ADC provides an output relative to a reference value directly related to the predefined range or the ADC provides an output independent of a limit of the predefined range and a comparison between the output and the predefined range is separately made by a different element. From block 302, the method continues to block 303.

In block 303, a decision is made as to whether or not the charge pump output is within a predefined range. If so, the method continues to block 310. In block 310, the NVM is ready for use. Block 310 may comprise at least one feature of block 322. For example, NVM may be configured for use. As an example, configuration data may be read from the NVM, for example, from a test row of the NVM. As an example, the configuration data may be passed to a system-on-chip (SOC) controller and to NVM latches to configure the NVM for use.

In block 310, in response to the charge pump output being within a predefined range, the NVM is enabled to be accessed. As an example, referring to FIG. 1, the NVM is made accessible to application 119. As an example, application 119 may not be started or may be suspended until the NVM is enabled to be accessed in response to qualification of the charge pump output. Block 310 may be considered to be an embodiment of block 203 of FIG. 2.

If, in block 303, a decision is made that the charge pump output is not within the predefined range, the method continues to decision block 304. In decision block 304, a decision is made as to whether or not the maximum start-up time has been exceeded. If so, the method continues to block 308, where an error is indicated. Block 308 may comprise at least one feature of block 321. As an example, the error may be reported. As an example, the error may be reported to a system-on-chip (SOC) controller. As another example, the error may be reported by storing a value indicative of the error. As another example, the error may be reported by setting a flag indicating the error.

If, in decision block 304, a decision is made that the maximum start-up time has not been exceeded, the method continues to block 305. In block 305, in response to the charge pump output not being within a predefined range, more time is allowed, limited to a maximum start-up time, for the charge pump output to operate within the predefined range. As an example, referring to FIG. 1, controller 116 performs block 305. In accordance with at least one embodiment, block 305 may be performed iteratively. For example, more time may be allowed for the charge pump output to operate within the predefined range after a change of a parameter affecting charge pump operation has been made. In accordance with at least one embodiment, block 305 may be performed continuously, wherein the more time allowed by multiple iterations of block 305 may be temporally continuous and cumulative. Block 305 may be implemented as indicated by block 325. For example, a soft reset of the NVM may be performed. As another example, an operational parameter of the charge pump is changed. As an example, a clock frequency of the NVM may be changed. As another example, an output level of the charge pump may be changed. From block 305, the method returns to block 302.

Figure 4:
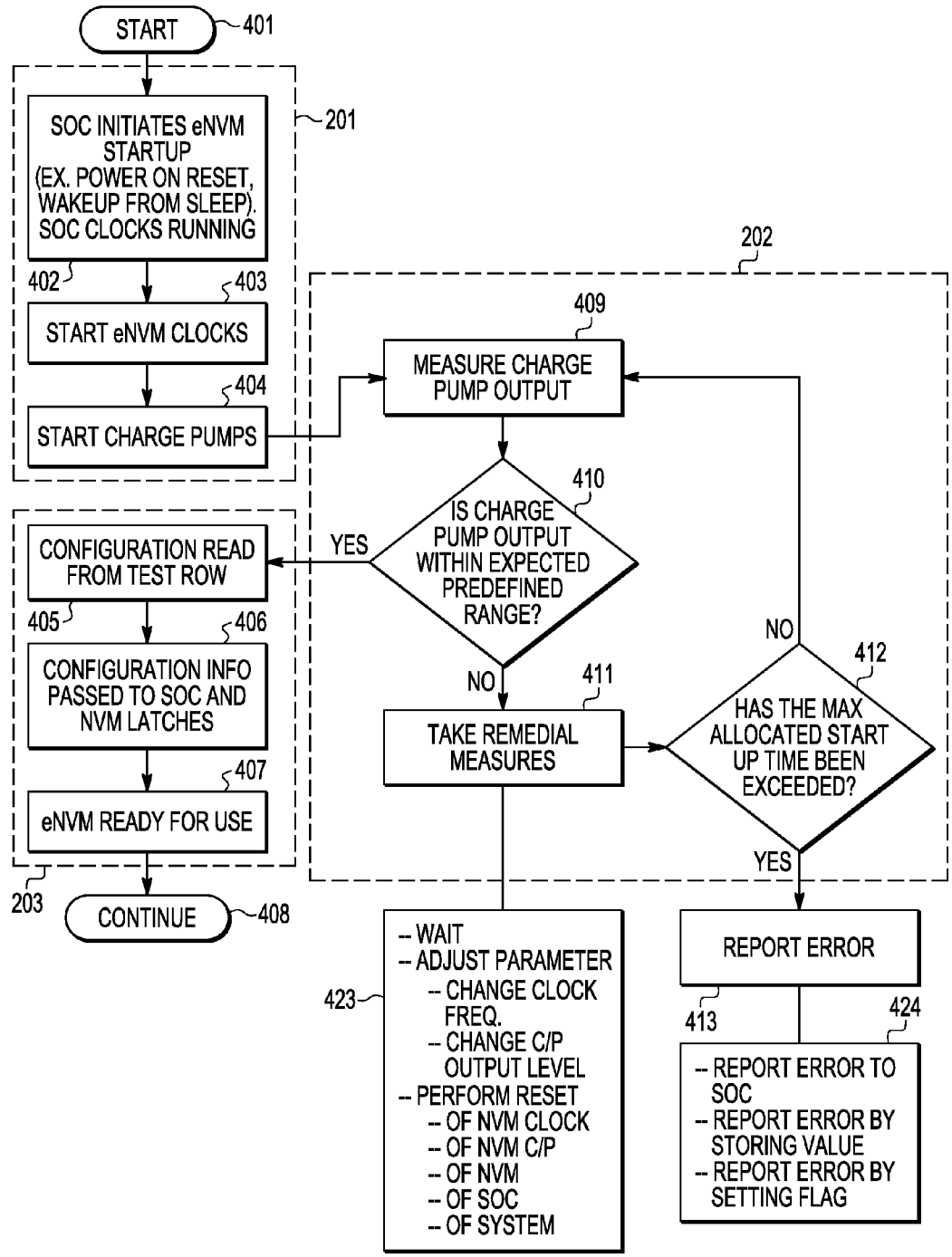
FIG. 4 is a flow diagram illustrating a method for start-up of a NVM using an analog-to-digital converter (ADC) module in accordance with at least one embodiment.

FIG. 4 is a flow diagram illustrating a method for start-up of an NVM using an analog-to-digital converter (ADC) in accordance with at least one embodiment. The method 400 begins in block 401. From block 401, the method continues to an embodiment of block 201 of FIG. 2 which includes blocks 402, 403, and 404. In block 402, the SOC initiates non-volatile memory (NVM) start-up (e.g., power-on reset, wakeup from sleep, etc.) with the SOC clocks running. As an example, with reference to FIG. 1, NVM controller 124 may initiate NVM start-up in block 402. As another example, with reference to FIG. 1, controller 116 may initiate NVM start-up in block 402. From block 402, the method continues to block 403.

In block 403, operation of the NVM clocks commences. As an example, referring to FIG. 1, controller 116 (or controller 124) causes operation of NVM clocks 127 to commence. From block 403, the method continues to block 404. In block 404, operation of the NVM charge pumps commences. As an example, referring to FIG. 1, operation of NVM charge pump 101 commences in response to the NVM controller 124. Alternatively, referring to FIG. 1, controller subsystem 117, e.g., via controller 116, can cause operation of NVM charge pump 101 to commence. From block 404, the method continues to an embodiment of block 202 of FIG. 2 which includes block 409, decision block 410, block 411, and decision block 412.

In block 409, the analog-to-digital converter (ADC) measures the charge pump output. As an example, referring to FIG. 1, ADC module 104 measures the charge pump output at node 107 of NVM charge pump 101. From block 409, the method continues to decision block 410. In decision block 410, a decision is made as to whether or not the charge pump output is within an expected predefined range. As an example, referring to FIG. 1, controller 116 determines whether the measurement from block 409 is within the expected predefined range.

Multiple charge pumps may be used to obtain different voltage levels which may be used to provide desired voltage differences between nodes of a memory bit cell. Different voltage levels may be used for different memory operations. During system start-up, it is likely that a memory read operation will be performed before any memory write operation or memory erase operation might occur. Thus, an example relating to a read charge pump will be described, although it should be understood that embodiments may be implemented for other charge pumps. For an example where a read charge pump is to have a nominal output of +4.4 volts, an expected predefined range may be, for example, +4.0 to +4.7 volts. Expected predefined ranges may be similarly defined with respect to other charge pump voltage levels, for example, a positive high-voltage (HV) charge pump voltage level of +8.5 volts, a negative HV charge pump voltage level of −8.5 volts, a drain charge pump voltage level of +4.8 volts, and the like. A level shifter circuit may be used to measure voltage levels outside of an input range of an ADC. For example, if an ADC measures positive voltages, a level shifter circuit may be used to shift the −8.5 volt level of the negative HV charge pump voltage level to a positive voltage level that can be measured by the ADC.

If the charge pump output is not within the expected predefined range, the method continues to block 411, where remediation of the charge pump's lack of readiness is provided. Block 423 provides examples of remedial measures that may be performed in block 411. Remediation of the charge pump's lack of readiness may be accommodated by allowing the charge pump more time to achieve readiness (e.g., for the charge pump output to enter the expected predefined range. Such time, if it is provided, may be in addition to or in place of allowing a delay to occur between previous blocks, such as between blocks 204 and 209, as described above. Alternatively, remediation can include a soft reset operation that restarts the charge pump, which may bring the charge pump output in compliance with the expected predefined range. As yet another example remediation, an operational parameter of the charge pump may be adjusted to increase the likelihood of the charge pump achieving operation such that the charge pump output is within the expected predefined range. Various operational parameters of the charge pump that can be adjusted include: a clock frequency of an NVM clock; and the output level of the charge pump. An NVM clock may also be restarted at block 411 to address the charge pump's lack of readiness. From block 411, the method continues to decision block 412, where a decision is made as to whether or not the maximum allocated start-up time has been exceeded. If not, the method returns to block 409, where the charge pump output is again measured. If so, the method continues to block 413, where a controller reports an error. Block 424 provides examples of error reporting that may be performed. As an example, the controller may send an error status message to a system-on-chip (SOC) controller. As another example, the controller may store a value representative of the error. As yet another example, the controller may set a flag that indicates the error.

If, in decision block 410, a decision was made that the charge pump output is within the expected predefined range, the method continues to an embodiment of block 203 of FIG. 2 which includes blocks 405, 406, and 407. In block 405, a configuration is read from a test row of the NVM. From block 405, the method continues to block 406. In block 406, configuration information read in block 405 is passed to SOC and NVM latches. From block 406, the method continues to block 407. In block 407, the NVM is determined to be ready for use. From block 407, the method continues to block 408. In block 408, the method continues, allowing an application to begin accessing the NVM. As an example, referring to FIG. 1, application 119 is allowed to begin accessing the NVM.

It will be appreciated that the flow of FIG. 4 is representative of a particular method and that additional blocks can occur between the illustrated blocks. For example, the method may continue immediately from block 404 to block 409, or a delay may occur between block 404 and block 409. Such a delay may be based on an amount of time expected to allow a charge pump started in block 404 to produce an output within an expected predefined range by the time the measurement of the charge pump output is made in block 409.

Figure 5:
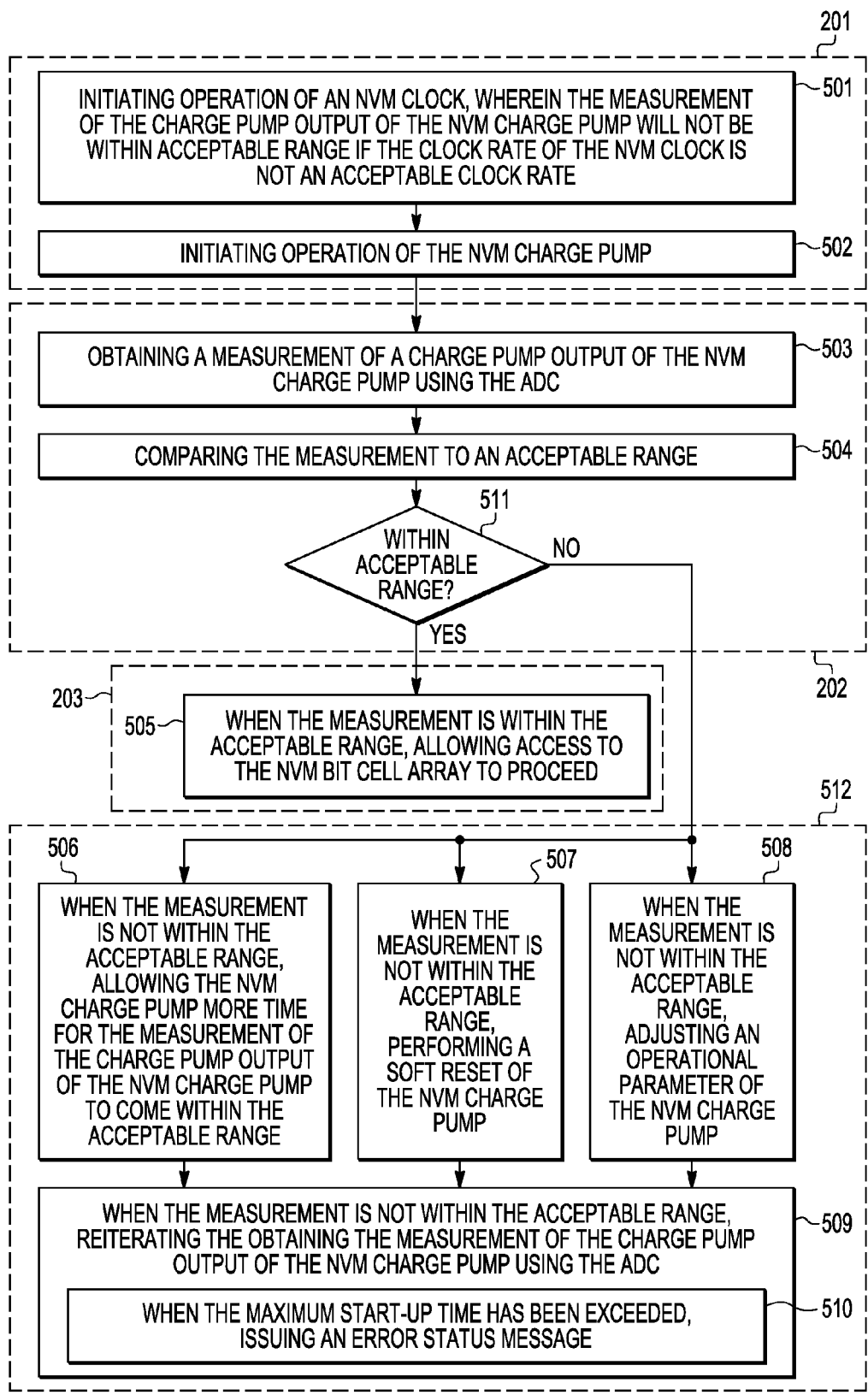
FIG. 5 is a flow diagram illustrating a method for start-up of a NVM using an analog-to-digital converter (ADC) module implemented in NVM apparatus in accordance with at least one embodiment.

FIG. 5 is a flow diagram illustrating a method for start-up of a NVM using an analog-to-digital converter (ADC) implemented in an NVM apparatus in accordance with at least one embodiment. The method 500 begins in block 501. In block 501, operation of a NVM clock is initiated, wherein measurement of the charge pump output of the NVM charge pump will not be within the acceptable range if a clock rate of the NVM clock is not an acceptable clock rate. NVM clock refers a clock used by the NVM, which may or may not be within (i.e., part of) the NVM itself. As an example, referring to FIG. 1, operation of the NVM clocks 127 is initiated. From block 501, the method continues to block 502. In block 502, operation of the NVM charge pump is initiated. As an example, referring to FIG. 1, operation of the NVM charge pump 101 is initiated. Blocks 501 and 502 may be considered to be an embodiment of block 201 of FIG. 2. From block 502, the method continues to block 503. In block 503, a measurement of a charge pump output of the NVM charge pump is obtained using the ADC. As an example, referring to FIG. 1, a measurement of a charge pump output at node 107 of NVM charge pump 101 is obtained using the ADC module 104. From block 503, the method continues to block 504. In block 504, the measurement is compared to an acceptable range. As an example, referring to FIG. 1, controller 116 compares the measurement to an acceptable range.

From block 504, the method continues to decision block 511, where a decision is made as to whether or not the measurement is within the acceptable range. Block 503, block 504, and decision block 511 may be considered to be an embodiment of block 202 of FIG. 2. From decision block 511, the method continues to block 505 in response to the measurement being within the acceptable range or to at least one of block 506, block 507, block 508, the like, or any combination thereof, in response to the measurement not being within the acceptable range. In block 505, in response to the measurement being within the acceptable range, access to the NVM bit cell array is allowed to proceed. As an example, referring to FIG. 1, in response to the measurement being within the acceptable range, access to the NVM bit cell array 121 by application 119 via intervening elements, for example, NVM controller 124, is allowed to proceed. Block 505 may be considered to be an embodiment of block 203 of FIG. 2. In block 506, in response to the measurement not being within the acceptable range, the NVM charge pump is allowed more time for the measurement of the charge pump output of the NVM charge pump to come within the acceptable range. In block 507, in response to the measurement not being within the acceptable range, a soft reset of the NVM charge pump is performed. As an example, referring to FIG. 1, controller 116 can perform a soft reset of the NVM charge pump 101, or NVM controller 124 can perform a soft reset of the NVM charge pump 101. In block 508, in response to the measurement not being within the acceptable range, an operational parameter of the NVM charge pump is adjusted. As an example, referring to FIG. 1, controller 116 can adjust an operational parameter of the NVM charge pump 101, or the NVM controller 124 adjusts an operational parameter of the NVM charge pump 101. From any of blocks 506, 507, or 508, the method continues to block 509. In block 509, in response to the measurement not being within the acceptable range, the obtaining the measurement of the charge pump output of the NVM charge pump using the ADC is reiterated. As an example, referring to FIG. 1, in response to the measurement not being within the acceptable range, controller 116 reiterates the obtaining the measurement of the charge pump output of the NVM charge pump using the ADC. As an example, referring to FIG. 1, in response to the measurement not being within the acceptable range, NVM controller 124 reiterates the obtaining the measurement of the charge pump output of the NVM charge pump using the ADC. Block 509 may comprise block 510. In block 510, in response to a maximum start-up time having been exceeded, an error status message is issued. Blocks 506, 507, 508, and 509 (which may or may not include block 510) may be considered to be an embodiment of a larger block 512 for attempting remediation when the measurement is not within the acceptable range.

In accordance with at least one embodiment, apparatus comprises a controller comprising logic to control the controller to perform at least one method. Such logic may comprise, for example, a state machine or firmware executable to perform operations, including logical operations, thereby allowing performance of the at least one method. The logic may control, for example, operation of an NVM module, including performance of a start-up sequence. Such apparatus also comprises an analog-to-digital converter (ADC) module. The ADC module is connected to the controller, allowing the ADC module to provide measurements of the charge pump output to the controller. In accordance with at least one embodiment, the controller instructs the ADC module to perform a measurement of the charge pump output during the start-up sequence. Based on the measurement received by the controller from the ADC module, the controller may allow the start-up sequence to continue, may provide more time for the charge pump output to achieve a value within an acceptable range, may adjust a charge pump operational parameter of the charge pump to bring the charge pump output to be within the acceptable range, may issue an error status message indicating inability of the charge pump to provide a charge pump output within the acceptable range within an allowable time, may perform the like, or may perform any combination thereof.

A variety of erroneous modes may be detected and corrected according to at least one embodiment. For example, if a NVM clock fails to start up properly (e.g., starts up at a harmonic, such as a third harmonic, of its intended operating frequency), it will cause improper operation of the NVM charge pump, which can be detected by measuring the charge pump output using an analog-to-digital converter (ADC).

Since the NVM clock oscillator is designed to operate at its fundamental frequency, not at a harmonic of its fundamental frequency, harmonic operation cannot be sustained, so, after some time, the harmonic state ends, and the NVM clock oscillator returns to the fundamental state. Thus, by measuring the charge pump output, waiting for the charge pump output have a value within an acceptable range, and measuring the charge pump output again to determine the value to be within the acceptable range, proper operation of a NVM clock oscillator can be assured even after the NVM clock oscillator has begun operating in a harmonic state. Thus, it is possible to ensure that the charge pump is normal and operating properly before completing the start up/wake up sequence, and doing so can prevent failure of a customer application in a system comprising NVM. Assuring proper operation of a NVM subsystem is especially important for critical applications, such as automotive applications. Almost all automotive microcontrollers have built-in ADC modules which, in accordance with at least one embodiment, could be used to monitor the charge pump output. Moreover, most modern microcontrollers include ADC capability, allowing at least one embodiment to be easily implemented for a wide variety of applications.

In accordance with at least one embodiment, instead of attempting to change a charge pump operational parameter to attempt to achieve proper charge pump output, a process of waiting for the charge pump to operate properly, as verified by measurement of a value of the charge pump output, allows proper charge pump operation to be achieved simply and efficiently. Moreover, such an approach avoids unnecessary adjustment of a NVM operational parameter, which might frustrate the NVM's tendency to restore itself to proper operation without intervention. For example, if a NVM clock were to start up in a transient undesired harmonic state, resulting in an improper charge pump output, an attempt to adjust a charge pump operational parameter to obtain a proper charge pump output may be futile if the NVM clock reverts to operation in its desired fundamental state, thereby necessitating further adjustment of the charge pump operational parameter to restore the charge pump output to the value it would have had but for the transient undesired harmonic state of the NVM clock. Also, an attempt to adjust another NVM operational parameter, such as the clock frequency of the NVM clock, may be futile if the NVM clock reverts to operation in its desired fundamental state, as the attempted adjustment might overcorrect for the problem, given the NVM clock's tendency to correct the problem itself without intervention. Therefore, the wait-and-measure iterations, in accordance with at least one embodiment, may provide better system performance than attempted adjustment of operational parameters.

In accordance with at least one embodiment, as opposed to adjusting the charge pump output for regulation to improve the desired performance, ensuring that the charge pump is stable and correct by utilizing an ADC module prior to usage of a NVM (i.e., prior to performing a memory operation accessing (e.g., reading, writing, or erasing) the NVM) can validate proper operation of the NVM in a decisive manner. Such decisive validation of NVM operation is capable of enabling zero-defect products for demanding applications (e.g., automotive applications). Such decisive validation provides a preventative method to ensure the NVM charge pump is robust prior to any operations, thereby avoiding failures and increasing reliability.

At least one embodiment may be implemented for a non-volatile memory (NVM) device. For example, at least one embodiment may be implemented for a flash memory device. At least one embodiment may be implemented for a floating gate memory device. As an example, at least one embodiment may be implemented for a non-volatile floating gate memory device. Examples of types of memory devices for which at least one embodiment may be implemented include flash memory devices, traditional electrically erasable programmable read-only memory (EEPROM) devices, ferroelectric random access memory (FeRAM), magnetoresistive random access memory (MRAM), programmable metallization cell (PMC) memory, and phase change memory (PCM). While a reduced voltage may be used with some memory technologies to detect a latent slow erase bit, a reduced current, a reduced pulse width, a reduced number of pulses, the like, or any combination thereof may be used with the same or other memory technologies to detect a latent slow erase bit.

Embodiments may be practiced with various memory technologies. For example, embodiments may be practiced with NOR flash memory or with NAND flash memory. Embodiments may be practiced with one-bit-per-cell (i.e., single-level cell (SLC)) and multiple-bit-per-cell (multiple-level cell (MLC)) memory technologies. Embodiments may be practiced with conductive (e.g., polycrystalline silicon) or non-conductive (e.g., silicon nitride ($Si_3N_4$) or metal nanocrystal) floating gate technologies. Embodiments may be practiced with memory devices using hot carrier injection or a quantum tunneling erasure mechanism.

In accordance with at least one embodiment, a method comprises starting a charge pump for a non-volatile memory (NVM), measuring a charge pump output of the charge pump, then, in response to the charge pump output not being within a predefined range, allowing more time, limited to a maximum start-up time, for the charge pump output to operate within the predefined range, and, in response to the charge pump output being within a predefined range, deeming the NVM to be ready for use. In accordance with at least one embodiment, the method further comprises utilizing an analog-to-digital converter to measure the charge pump output. In accordance with at least one embodiment, the utilizing the analog-to-digital converter to measure the charge pump output further comprises utilizing an on-board analog-to-digital converter to measure the charge pump output. In accordance with at least one embodiment, the, in response to the charge pump output not being within the predefined range, allowing more time, limited to the maximum start-up time, for the charge pump output to operate within the predefined range further comprises performing a soft reset of the NVM. In accordance with at least one embodiment, the in response to the charge pump output not being within the predefined range, allowing more time, limited to the maximum start-up time, for the charge pump output to operate within the predefined range further comprises changing an operational parameter of the charge pump. In accordance with at least one embodiment, the, in response to the charge pump output not being within the predefined range, allowing more time, limited to the maximum start-up time, for the charge pump output to operate within the predefined range further comprises, in response to the maximum start-up time having been exceeded, issuing an error status message. In accordance with at least one embodiment, the, in response to the maximum start-up time having been exceeded, issuing the error status message further comprises issuing the error status message to a system-on-a-chip (SOC) controller.

In accordance with at least one embodiment, a method comprises starting a non-volatile memory (NVM) clock, starting a NVM charge pump, verifying proper charge pump output using an analog-to-digital converter (ADC), and proceeding with configuration of the NVM after the proper charge pump output has been verified. In accordance with at least one embodiment, the verifying proper charge pump output using the ADC comprises iteratively measuring a charge pump output of the NVM charge pump and comparing a measurement to a predefined range. In accordance with at least one embodiment, the iteratively measuring the charge pump output of the NVM charge pump and comparing the measurement to the predefined range further comprises, in response to a maximum start-up time having been exceeded, discontinuing the iteratively measuring the charge pump output and instead issuing an error status message. In accordance with at least one embodiment, the, in response to the maximum start-up time having been exceeded, discontinuing the iteratively measuring the charge pump output and instead issuing the error status message further comprises, in response to the maximum start-up time having been exceeded, discontinuing the iteratively measuring the charge pump output and instead issuing the error status message to a system-on-a-chip (SOC) controller. In accordance with at least one embodiment, the iteratively measuring the charge pump output of the NVM charge pump and comparing the measurement to the predefined range comprises allowing more time for the charge pump output to achieve a value within an acceptable range. In accordance with at least one embodiment, the iteratively measuring the charge pump output of the NVM charge pump and comparing the measurement to the predefined range further comprises iteratively adjusting an operational parameter of the charge pump.

In accordance with at least one embodiment, an apparatus comprises a non-volatile memory (NVM) bit cell array, a NVM charge pump, the NVM charge pump connected to the NVM bit cell array, an analog-to-digital converter (ADC), the ADC connected to the NVM charge pump, and a controller, the controller connected to the ADC. The controller comprises logic configured to cause the controller to perform a method. The method comprises initiating operation of the NVM charge pump, obtaining a measurement of a charge pump output of the NVM charge pump using the ADC, comparing the measurement to an acceptable range, and, in response to the measurement being within the acceptable range, allowing access to the NVM bit cell array to proceed.

In accordance with at least one embodiment, the method further comprises, in response to the measurement not being within the acceptable range, reiterating the obtaining the measurement of the charge pump output of the NVM charge pump using the ADC. In accordance with at least one embodiment, the method further comprises, in response to the measurement not being within the acceptable range, allowing the NVM charge pump more time for the measurement of the charge pump output of the NVM charge pump to come within the acceptable range. In accordance with at least one embodiment, the method further comprises, in response to the measurement not being within the acceptable range, performing a soft reset of the NVM charge pump. In accordance with at least one embodiment, the method further comprises, in response to the measurement not being within the acceptable range, adjusting an operational parameter of the NVM charge pump. In accordance with at least one embodiment, the method further comprises initiating operation of an NVM clock, wherein the measurement of the charge pump output of the NVM charge pump will not be within the acceptable range if a clock rate of the NVM clock differs is not an acceptable clock rate. In accordance with at least one embodiment, the, in response to the measurement not being within the acceptable range, reiterating the obtaining the measurement of the charge pump output of the NVM charge pump using the ADC further comprises, in response to a maximum start-up time having been exceeded, issuing an error status message.

What is claimed is:

1. A method comprising:
   starting a charge pump for a non-volatile memory (NVM);
   monitoring a voltage at an output of the charge pump with an analog-to-digital converter;
   reading configuration information from the NVM in response to detecting with the analog-to-digital converter the voltage at the output to be within a predefined range;
   configuring the NVM for operation based on the configuration information read from the NVM; and
   enabling the NVM to be accessed in response to the configuring the NVM for operation.

2. The method of claim 1 wherein the monitoring the voltage at the output of the charge pump output further comprises:
   allowing more time for the voltage at the output to be within the predefined range.

3. The method of claim 1 wherein the analog-to-digital converter is integrated on a common die as the charge pump to measure the voltage at the output.

4. The method of claim 1 wherein the monitoring the voltage at the output of the charge pump further comprises:
   performing a restart of the charge pump.

5. The method of claim 1 wherein the monitoring the voltage at the output of the charge pump further comprises:
   changing an operational parameter of the charge pump.

6. The method of claim 1 further comprising:
   in response to detecting with the analog-to-digital converter the voltage at the output not to be within the predefined range, issuing an error status message.

7. The method of claim 6 wherein issuing the error status message further comprises:
   issuing the error status message to a controller.

8. A method comprising:
   starting a non-volatile memory (NVM) clock, wherein the NVM clock affects operation of an NVM charge pump;
   starting the NVM charge pump;
   verifying proper charge pump output voltage at an output of the NVM charge pump using an analog-to-digital converter (ADC);
   reading configuration information from the NVM in response to the verifying the proper charge pump output voltage: and
   proceeding with configuration of the NVM using configuration information read from the NVM after the proper charge pump output voltage has been verified.

9. The method of claim 8 wherein the proper charge pump output voltage is applied to a bit cell of a bit cell array of the NVM to perform a memory operation on the bit cell.

10. The method of claim 8 wherein the verifying proper charge pump output voltage using the ADC comprises:
    iteratively measuring a charge pump output voltage of the NVM charge pump and comparing a measurement to a predefined range.

11. The method of claim 10 wherein the iteratively measuring the charge pump output voltage of the NVM charge pump and comparing the measurement to the predefined range comprises:
    in response to the maximum start-up time having been exceeded, discontinuing the iteratively measuring the charge pump output voltage and instead issuing the error status message to a controller.

12. The method of claim 10 wherein the iteratively measuring the charge pump output voltage of the NVM charge pump and comparing the measurement to the predefined range further comprises:

iteratively adjusting an operational parameter of the charge pump.

13. The method of claim 8 further comprising:
allowing more time for the charge pump output voltage to achieve a value within the predefined range.

14. Apparatus comprising:
a non-volatile memory (NVM) bit cell array;
a charge pump, the charge pump coupled to the NVM bit cell array to provide, at an output, an output voltage to the array;
an analog-to-digital converter (ADC) module, the ADC module coupled to the output; and
a controller, the controller coupled to the ADC module, the controller comprising logic configured to cause the controller to initiate operation of the charge pump, to obtain a measurement of the output of the charge pump from the ADC module, to compare the measurement to an acceptable range, and, in response to the measurement being within the acceptable range, to read configuration information from the NVM bit cell array, to configure the apparatus for operation based on the configuration information read from the NVM bit cell array, and to allow access to the NVM bit cell array to proceed in response to configuration of the apparatus for operation.

15. The apparatus of claim 14 wherein the controller, in response to the measurement not being within the acceptable range, reiterates the obtaining the measurement of the output of the charge pump using the ADC module.

16. The apparatus of claim 15 wherein the controller, in response to the measurement not being within the acceptable range, allows the charge pump more time for the measurement of the output of the charge pump to come within the acceptable range.

17. The apparatus of claim 15 wherein the controller, in response to the measurement not being within the acceptable range, performs a restart of the charge pump.

18. The apparatus of claim 15 wherein the controller, in response to the measurement not being within the acceptable range, adjusts an operational parameter of the charge pump.

19. The apparatus of claim 18 wherein the operational parameter of the charge pump is selected from a group consisting of a clock frequency at which the charge pump operates and an output level of the charge pump.

20. The apparatus of claim 14 further comprising:
a clock having a clock output coupled to the charge pump, wherein the controller initiates operation of the clock, wherein the measurement of the output of the charge pump will not be within the acceptable range if a clock rate of the clock is not an acceptable clock rate.

* * * * *